United States Patent [19]
Taniguchi et al.

[11] Patent Number: 5,382,902
[45] Date of Patent: Jan. 17, 1995

[54] METHOD FOR ELIMINATING MOTIONAL ARTIFACTS IN MAGNETIC RESONANCE IMAGING

[75] Inventors: Yo Taniguchi, Kokubunji; Etsuji Yamamoto, Akishima, both of Japan

[73] Assignee: Hitachi, Ltd., Tokyo, Japan

[21] Appl. No.: 985,645

[22] Filed: Dec. 7, 1992

[30] Foreign Application Priority Data

Dec. 6, 1991 [JP] Japan ................. 3-322211

[51] Int. Cl.⁶ ............................................. G01V 3/00
[52] U.S. Cl. ..................................... 324/309; 324/307
[58] Field of Search ............... 324/309, 307, 306, 313, 324/314

[56] References Cited
U.S. PATENT DOCUMENTS 5,200,700  4/1993  Glover et al. ..................... 324/309
5,254,948 10/1993  Sano et al. ........................ 324/309

OTHER PUBLICATIONS

Bailes, D., et al., "Respiratory Ordered Phase . . . Artefacts in MR Imaging", Journ. of Computer Assisted Tomography, 9(4), pp. 835–838, 1985.
Ehman, R., et al., "Adaptive Technique for High-Definition MR Imaging of Moving Structures", Radiology 1989, 173, pp. 255–263.
Felmlee, J., et al., "Adaptive Motion Compensation in MR Imaging Without Use of Navigator Echoes", Radiology 1991, 179, pp. 139–142.

Primary Examiner—Louis Arana
Attorney, Agent, or Firm—Antonelli, Terry, Stout & Kraus

[57] ABSTRACT

A magnetic resonance imaging method for obtaining an image of an object laid in a space in which a static magnetic field is applied, so as to substantially eliminate motional artifacts. The method includes sequentially measuring a plurality of magnetic resonance views with a plurality of encodings by repeating a measurement sequence of exciting nuclear spins in said object, applying a phase-encoding field gradient along a first direction with programmed time integral to encode the excited spins, and detecting the encoded spins in the presence of a readout field gradient along a second direction to generate a magnetic resonance view so that measurements of magnetic resonance views with at least low-order encoding are obtained during the repetition of the measurement sequence. Thereafter respective magnetic resonance views are subjected to a first Fourier transformation so as to generate a plurality of projection views with a plurality of encodings forming a data matrix in a hybrid domain, displacements in respective projection views due to motion of the object are corrected using displacement information obtained from projection views with low-order encodings so as to generate a corrected data matrix in the hybrid domain, and the corrected data matrix is subjected to a second Fourier transformation so as to generate the image of the object.

19 Claims, 6 Drawing Sheets

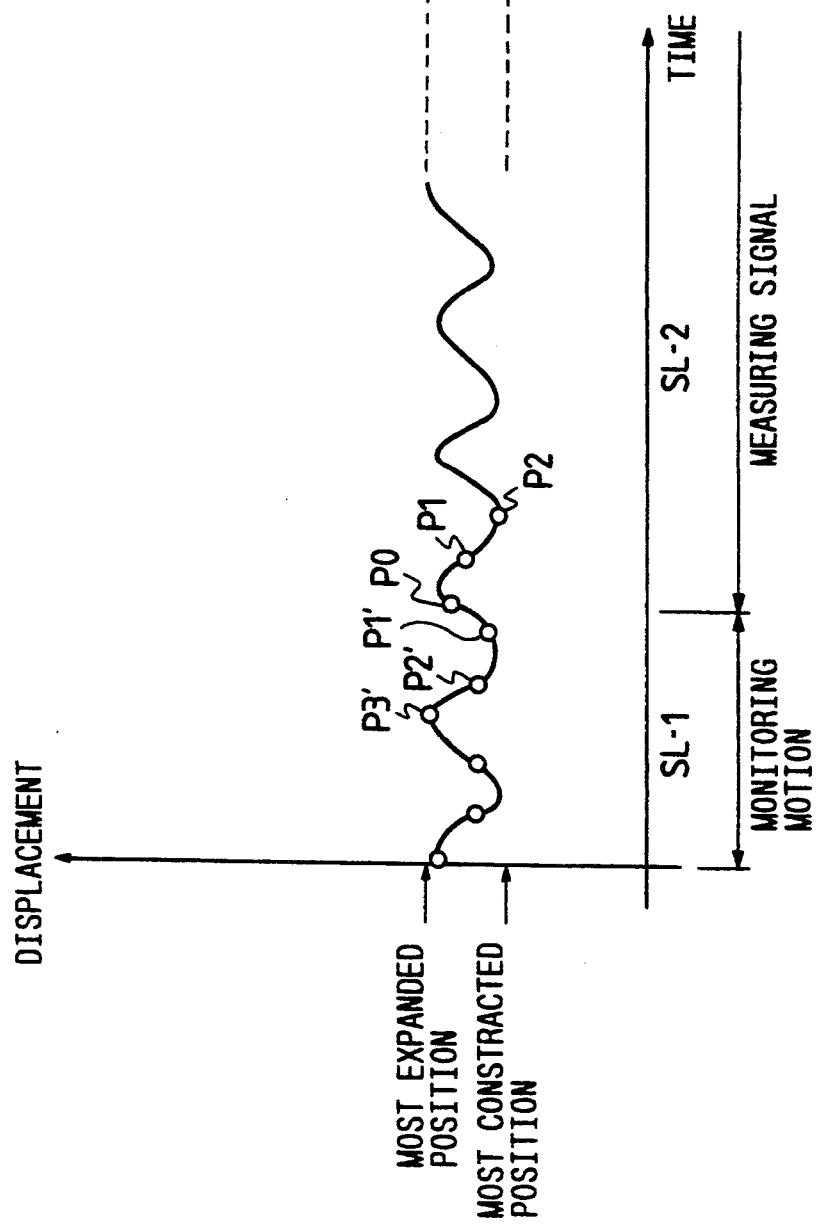

METHOD FOR ELIMINATING MOTIONAL ARTIFACTS IN MAGNETIC RESONANCE IMAGING

BACKGROUND OF THE INVENTION

The present invention relates to magnetic resonance imaging for diagnosis use and, in particular, to methods for eliminating ghosting artifacts in reconstructed images due to patient motion during MRI data acquisition and for increasing sharpness of the images.

There have been proposed many methods for reducing artifacts which occur in reconstructed images due to motion of the object to be imaged during MRI signal acquisition. The so-called breath holding method is a primitive method for reducing artifacts caused by patient respiration. The method imposes an excessive burden on a patient because it requires the patient to hold his or her breath during magnetic resonance signal measurement. Especially, the method cannot be effectively applied to the present day two-dimensional Fourier transform MRI techniques which take from several to several tens of minutes for manual measurement.

According to another method of a so-called gating MR method, the measuring time is substantially prolonged because the magnetic resonance signal is measured at a particular phase of patient's respiratory or cardiac cycle. However, this method requires additional equipment for monitoring breathing.

Another method called respiratory ordered phase encoding (ROPE) is described in the Journal of Computer Assisted Tomography 9 (4), pp. 835-838, 1985, wherein, a respiratory signal is used to determine the order in which rows of a data matrix for spin warp imaging are measured. Also, in this method, additional equipment is necessary for respiration monitoring According to a method described in Radiology 1989, 173, pp. 255-263, specially encoded navigator echoes that are interleaved with an imaging sequence are measured to obtain a record of patient motion during NMR signal acquisition. The record is used for correcting displacements which would cause artifacts and unsharpness in a reconstructed image.

A further method attempting to detect motion information by using phase-encoded image data without navigator echoes and to apply appropriate compensation thereto is described in Radiology 1991, 179, pp. 139-142 and is hereafter described referred to as the "self calibration method". According to this method, encoded views forming a data matrix for reconstructing an image are sequentially detected and subjected to Fourier transformation to create a hybrid domain data set. Transformed data is used to determine object position along readout axis for each view.

The ROPE method has an advantage that the measuring time is not increased for reducing motional artifacts, because the method requires no extra scanning nor extra echoes. However, such method has a limited effect on improving the grade of image. Although ghosting artifacts that degrade the parts of the image depicting not moving structures caused by moving structures can be eliminated, blurring of the images of moving structures remains. Further, the method requires additional equipment for respiration monitoring.

For the self-calibration method, more remarkable effects on improving the image can be expected, if the determination of object position is accurate. However, because views with high-order encodings suffer from poor S/N ratio, it is difficult to accurately detect the displacements in those views. The prior art suggests a way to solve the problem by placing small diameter markers on the exterior of the patient which give clear edges on those views. The markers, however, tend to cause discomfort to the patient and the markers are also an annoyance for operators.

SUMMARY OF THE INVENTION

It is therefore an object of the invention to overcome the above-noted problems of the prior art.

It is another object of the invention to provide a method for eliminating ghosting artifacts and unsharpness in reconstructed MR images due to motion of the patient to be imaged without placing any additional substance on the patient.

It is a further object of the invention to provide a method for eliminating degradation in MR images due to the motion of the object to be imaged without using additional equipment for sensing the motion.

It is yet another object of the invention to provide a method for obtaining an MR image without motional artifacts and having an improved S/N ratio.

It is a further object of the invention to provide a method for eliminating artifacts and unsharpness in a reconstructed image due to multi-axis motion of the object with minimized extra echo generation and detection.

The present invention is based on two-dimensional Fourier transform MR imaging techniques, such as spin warp imaging. A plurality of magnetic resonance views with a plurality of phase encodings are sequentially measured in the presence of a readout field gradient by repeating a measurement sequence. The respective views are subjected to a first Fourier transformation to provide a plurality of projection views which form a data matrix in a hybrid domain, an axis thereof being a spatial frequency and the other axis thereof being a spatial direction along which the readout field gradient is applied (readout direction). Among the projection views, those views with zero and nearly zero encodings have a good S/N ratio and recognizable edges which indicate the position of the object along the read-out direction. However, the higher the order of the encoding becomes, which means that the higher the spatial frequency components indicated by a projection view becomes, the lower becomes the S/N ratio which can be obtained in the corresponding projection view.

According to a feature of the present invention, information of the motion of the object during the repetition of a measurement sequence is derived from projection views with low-order encodings which have encoding amounts not larger than a marginal encoding amount for effective edge detection. In other words, the displacements of projection views with high-order encoding which have encoding amounts larger than the marginal encoding amount are determined or estimated from displacements detected in the projection views with low-order encodings. The displacements of the views, detected or estimated, are corrected, and then a corrected data matrix is subjected to a second Fourier transformation to generate an image of the object.

According to another feature of the invention, a specific phase encode changing order is employed during the repetition of the measurement sequence in order to increase the accuracy of the estimation of displacements of the projection views with high-order encodings.

Namely, measurements of magnetic resonance views with low-order encodings which have encoding amounts not larger than the marginal encoding amounts are obtained at spaced intervals, and measurements of magnetic resonance views with high-order encodings which have encoding amount larger than the marginal encoding amount are obtained between the spaced intervals. According to the phase encode changing order, the determination of displacements in the projection views with high-order encodings can be accurately obtained by interpolation processing using measured displacements detected in the projection views with low-order encodings.

According to a further feature of the invention, the measurement of the magnetic resonance views with low-order encodings include obtaining plural measurements at selected intervals with the same encoding amount. Projection views derived from magnetic resonance views with the same encoding amount are respectively subjected to edge detection for obtaining displacement information. The plural measurements with a same encoding amount within low-order encodings give more frequent detection of displacements of the objects, which result in substantially complete elimination of motional artifacts with a sharp reconstructed image even though the measurement time is slightly prolonged due to the plural scannings. The plural measured views with the same encoding amount may be used only for detection of displacements of the object. However, the extra views can also be utilized for improving the S/N ratio of a resulting image. For obtaining the improved S/N ratio, it is necessary to respectively correct the displacements in the projection views with the same encoding amount by using detected displacement information and to add the corrected projection views into an average projection view which form a row of a data matrix in a hybrid domain.

The methods mentioned above provide MR images in which ghosting artifacts and unsharpness due to motion of the object along the readout direction are eliminated either by using extra scannings or without using extra scanning. These methods can be expanded into a method for eliminating ghosting artifacts and unsharpness due to multi-axis motion of the object. For example, degradation due to two-dimensional motion along a readout direction and phase-encoding direction can be eliminated by employing a multi-echo sequence which generates and detects an MR echo according to one of the aforementioned methods and an extra echo without phase encodings, but with a frequency encode along a direction other than the readout phase-encoding direction. Even in these methods, the number of extra echoes to be generated and detected is minimized because displacements along the readout direction are derived from the MR echo for imaging.

These and other objects, features, and advantages of the present invention will become more apparent from the following description when taken in conjunction with the accompanying drawings which show, for purposes of illustration only, several embodiments of the present invention.

BRIEF DESCRIPTION OF THE DRAWINGS

FIGS. 10A and 10B show a signal acquisition method in relationship to respiration according to another embodiment of the present invention.

DESCRIPTION OF THE PREFERRED EMBODIMENTS

Figure 1:
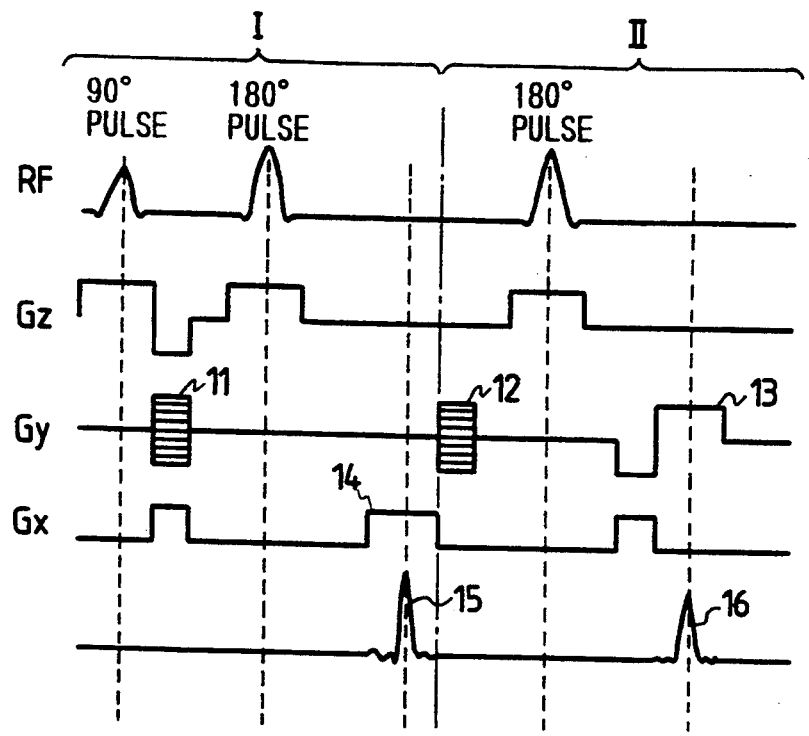
FIG. 1 is a diagram showing a signal measurement sequence employed in an embodiment of the invention.
Figure 2:
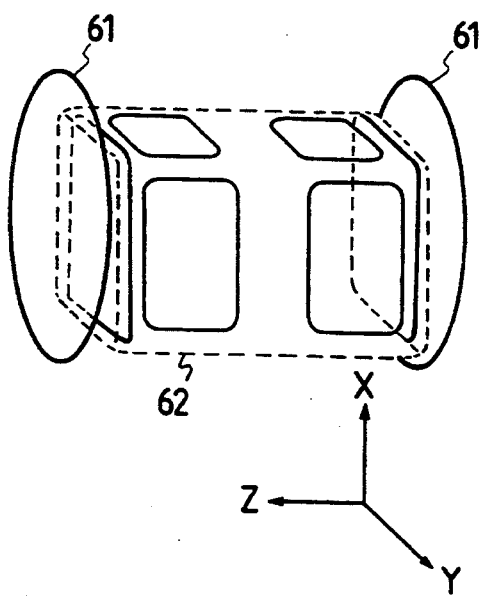
FIG. 2 is a diagram showing an inspection zone of an MR imaging system in accordance with the present invention.
Figure 3:
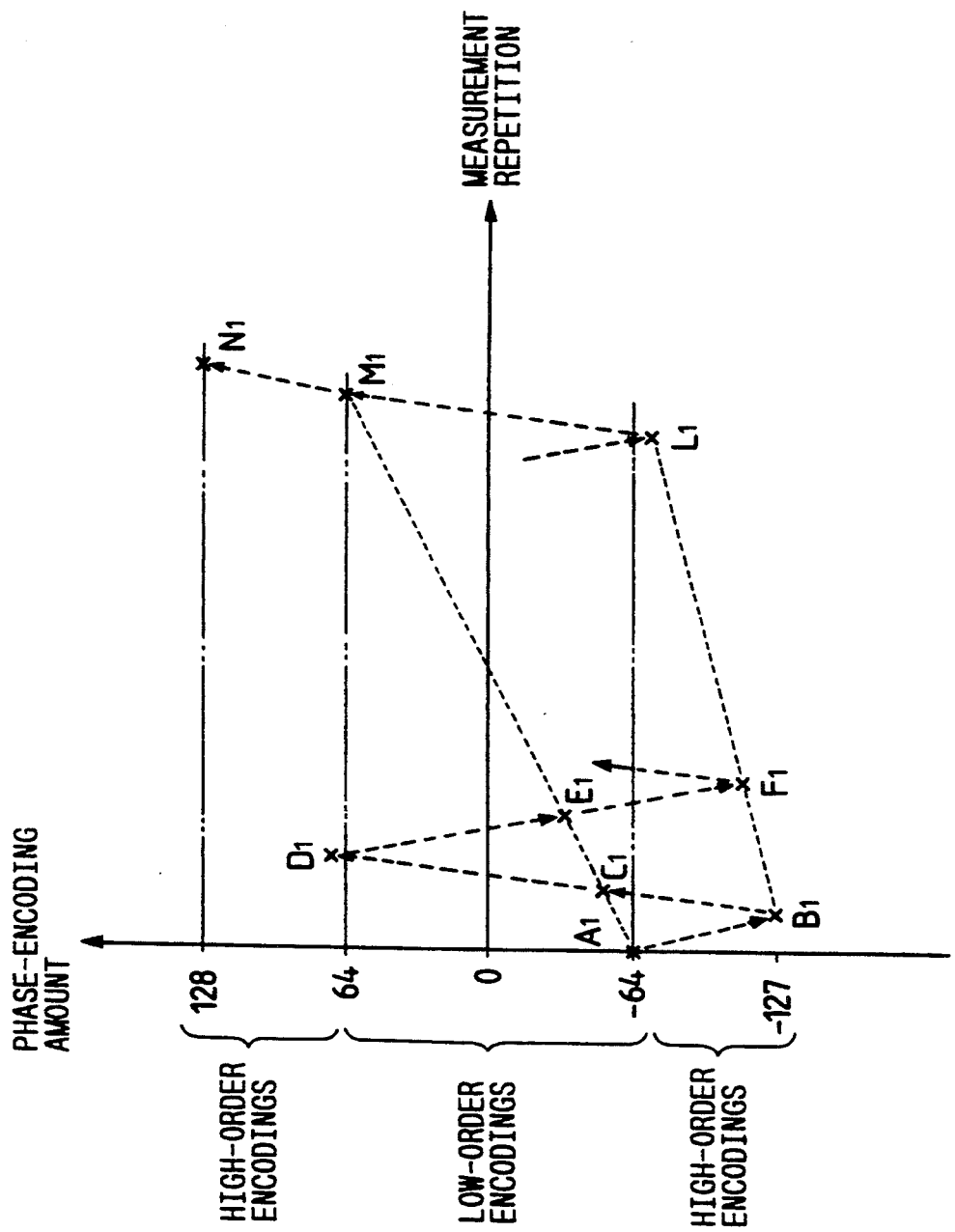
FIG. 3 is a diagram showing a phase encoding sequence according to the present invention.

Referring now to the drawings, in accordance with the present invention as shown in FIGS. 1–3, a slice image of an object is obtained which is free from ghosting artifacts and unsharpness due to one-dimensional motion of the object during MR signal acquisition. The signal acquisition is obtained by repeating a measurement sequence shown in part I of FIG. 1. An object to be imaged is laid in an inspection zone of an MR imaging system to which a substantially homogeneous magnetic field is applied by static magnetic generation system 61 as shown in FIG. 2. The sequence of FIG. 1 includes the steps of selective excitation of spins in the inspection zone by using a 90° RF pulse in the presence of a slice-selecting field gradient Gz along the Z-direction, application of a phase-encoding field gradient pulse 11 by using a y-direction field gradient Gy, application of a 180° RF pulse and detection of a resultant magnetic resonance echo 15 in the presence of a readout field gradient 14 by using an X-direction field gradient Gx. Instead of the 180° RF pulse, a dephasing-rephasing sequence for generating a gradient echo can be employed. Also, the excitation of spins can be effected by an RF pulse having a flip angle smaller than 90°. The direction readout field gradient 14 is selected for the main direction of the movement of the object. Namely, the directions of three field gradients are adjusted by individual or combined use of three gradient coil sets in a field gradient generation system 62 shown in FIG. 2 according to the direction of the motion of the object.

The time integral of the phase-encoding field gradient pulse 11 is changed for each repetition of the measurement sequence according to a program. Thus, 256 magnetic resonance views are sequentially acquired and those views have 256 different phase encoding amounts which can be expressed as $-127, -126, \ldots, -1, 0, 1, \ldots, 127, 128$. Among those magnetic resonance views, low-order views having encoding amounts not larger than a marginal encoding amount for effective edge detection are measured at intervals, and remaining views (high-order views) are measured between the intervals. Referring to FIG. 3, the marginal encoding amount for effective edge detection is considered to be one half of the maximum encoding amount. Namely, low-order views are views having encoding amounts from −64 to 64, and high-order views are views having encoding amounts from −127 to −65 and from 65 to 128. The low-order encoded views and the high order encoded view are measured alternately wherein A1, C1, E1, ... and M1 in FIG. 3 denote measurements of low-order encoded views, and B1, D1, F1, ..., L1 and N1 denote measurement of high-order encoded views.

Data of each magnetic resonance view acquired through the MR signal acquisition sequence of FIGS. 1 and 3 is subjected to one-dimensional Fourier transformation. Thus, 256 projection views having respective phase-encoding amounts are obtained, and the data is stored in a data memory. A transformation from a data matrix in a spatial frequency domain having a coordinate system (kx, ky) into a data matrix in a hybrid domain having another coordinate system (X, ky) is effected. However, respective rows of the transformed data matrix include displacements along the X-direction (readout direction) due to the motion of the object during MR signal acquisition.

Figure 4:
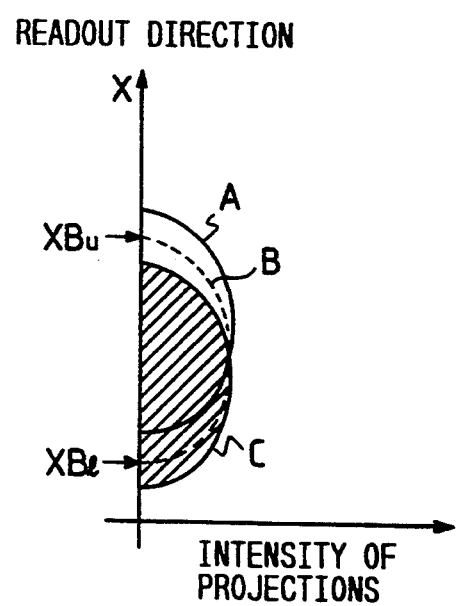
FIG. 4 is a diagram showing detected and estimated displacements in projection views based upon the sequence of FIG. 3.

In order to correct the displacements, rows of the data matrix which indicate projection views with low-order phase encodings (low-order projection views) are respectively subjected to edge detection processing. By the edge detection processing, the position of one edge or positions of both edges of each projection are detected as displacement information. Then displacements of projection views with high-order encodings (high-order projection views) are determined or estimated by using the displacement information detected in low-order projection views. For example when the motion of the object follows a one-dimensional parallel movement projection views A and C as shown in FIG. 4 and associated with the measurements A1 and C1 in FIG. 3 will respectively result. At this time, the position of a projection view B (shown in broken line) with high-order encoding associated with the measurement B1 can be estimated. In the embodiment, edge positions XBu and XBL represent displacement information for projection view B and are obtained by use of a linear interpolation method although other interpolation methods may be utilized. Displacements in all of projection views with high-order encodings are estimated in the same manner. The displacements detected in the low-order projection views and displacements estimated in the high-order projection views are respectively corrected. For example, the correction is effected by shifting data of respective projection views in a data memory so that the center of respective views are positioned at the center of respective rows of a memory array. Thus, a corrected data matrix in a hybrid domain is derived. Thereafter, the corrected data matrix is subjected to Fourier transformation along the phase-encoding direction. Namely, data in a respective column of the memory array is subjected to Fourier transformation, whereby a slice image of the object is obtained. Ghosting artifacts and unsharpness in the resultant image due to movement along the readout direction during MR signal acquisition are eliminated.

The distinction between "low-order" and "high-order", or in other words, the value of the "marginal phase-encoding amount for effective edge detection", is selected according to the intensity or S/N ratio of the projections. For example, the value of the marginal phase-encoding amount should be selected to be about one quarter of the maximum phase-encoding amount depending on the MR imaging system employed, measurement condition or the object to be imaged. In such case, each of low-order views having encoding amounts not larger than the selected marginal phase-encoding amount are measured only once for every four time measurements of views, if an MR signal acquisition sequence without extra scanning is employed. The displacements in high-order projection views can be estimated by interpolation even in such case. If the motion of the object is a cyclic motion or a quasi-cyclic motion, the accuracy of the displacement estimation is substantially guaranteed in the condition that the interval of measurement of low-order views from which displacements are actually detected is shorter than one half cycle of the motion.

Figure 5:
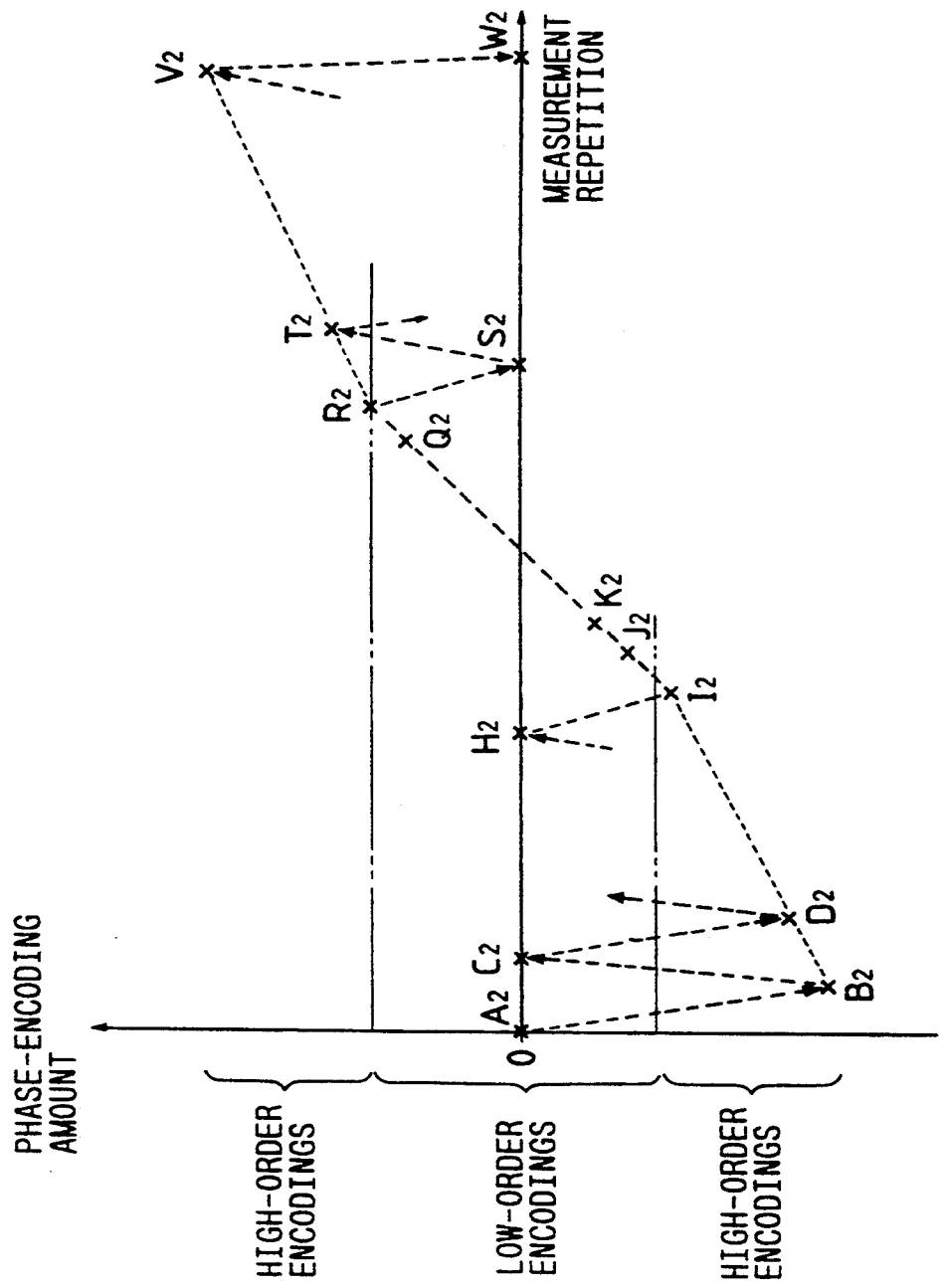
FIG. 5 is a diagram showing a phase encoding sequence of another embodiment of the invention.

FIG. 5 shows a phase-encoding amount variation method employed in another embodiment of the invention. In this embodiment, the MR signal acquisition sequence includes extra scanning for deriving displacement information. In FIG. 5, measurements denoted as B2, D2, ..., I2 and R2, T2, ..., V2 are measurements of high-order views from which displacement information is difficult to derive. Accordingly, those measurements are effected alternately with extra or plural measurements denoted as A2, C2, ..., H2 or S2, ..., W2. Measurements denoted are J2, K2, ..., Q2 are measurements of low-order views from which displacements can be effectively detected. Accordingly, those measurements are sequentially effected without inserting extra measurements. All of the measured views are subjected to Fourier transformation to provide projection views. Displacements in low-order projection views which are derived from measurements J2, K2, ..., Q2 are detected in themselves. While displacements in high-order projection views which are derived from measurements B2, D2, ..., I2 and R2, T2, ..., V2 are estimated by using displacement information detected in extra projection views with zero phase-encoding amount derived from the extra measurements A2, C2, ... H2 and S2, ..., W2. The manner of correction of displacements and for deriving an image are similar to the procedure described in the foregoing embodiment.

The order of measurements shown in FIG. 5 can be effected according to a fixed MR signal acquisition program. It is, however, also possible to insert an extra measurement when it is determined that a projection view, which has just been derived, does not have a sufficient intensity for detection of displacements.

The extra projection views derived from the extra measurements have the same phase-encoding amount of zero, according to the embodiments shown in FIG. 5. Thus, such extra views can be utilized not only for obtaining displacement information, but also for improving the S/N ratio in a resultant image. To obtain the effect on the S/N ratio, displacements in all of the extra projection should also be corrected by using displacement information detected in themselves. Then, all of the corrected projection views which have zero phase-encoding amounts are added into an averaged projection view. The average projection view is used as a row of a data matrix in a hybrid domain which is subjected to a final Fourier transformation to obtain the image.

It is apparent that the embodiment represented by the sequence of FIG. 3 can also be modified so as to obtain an affect on the S/N ratio. The measurement of low-order views A1, C1, E1 ... M1 shown in FIG. 3 may include plural time measurements with the same phase-encoding amount. All of the projection views with the same phase-encoding amount are added into an average projection view after they are respectively subjected to displacement correction. The average projection view is used as a row of a data matrix in a hybrid domain which is subjected to a final Fourier transformation. In such modifications, the plural time measurements with the same phase-encoding amount are not limited to zero phase-encoding. That is, it is more effective for improving S/N ratio in a resultant image to respectively derive averaged projection views for several phase-encoding amounts around zero.

Figure 6:
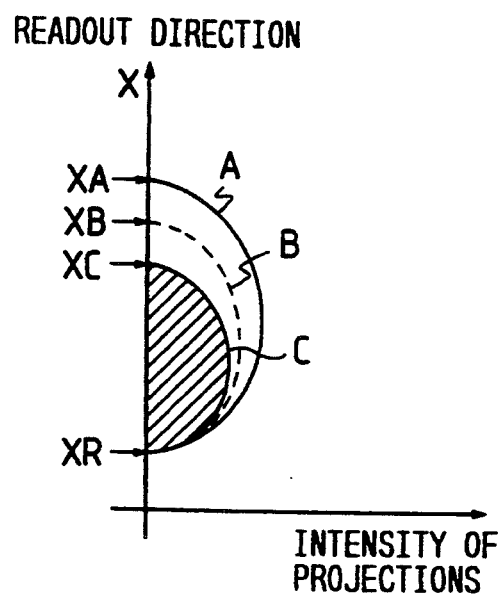
FIG. 6 is a diagram showing detected and estimated displacements in projection views according to another motional position estimating method of the present invention.
Figure 7:
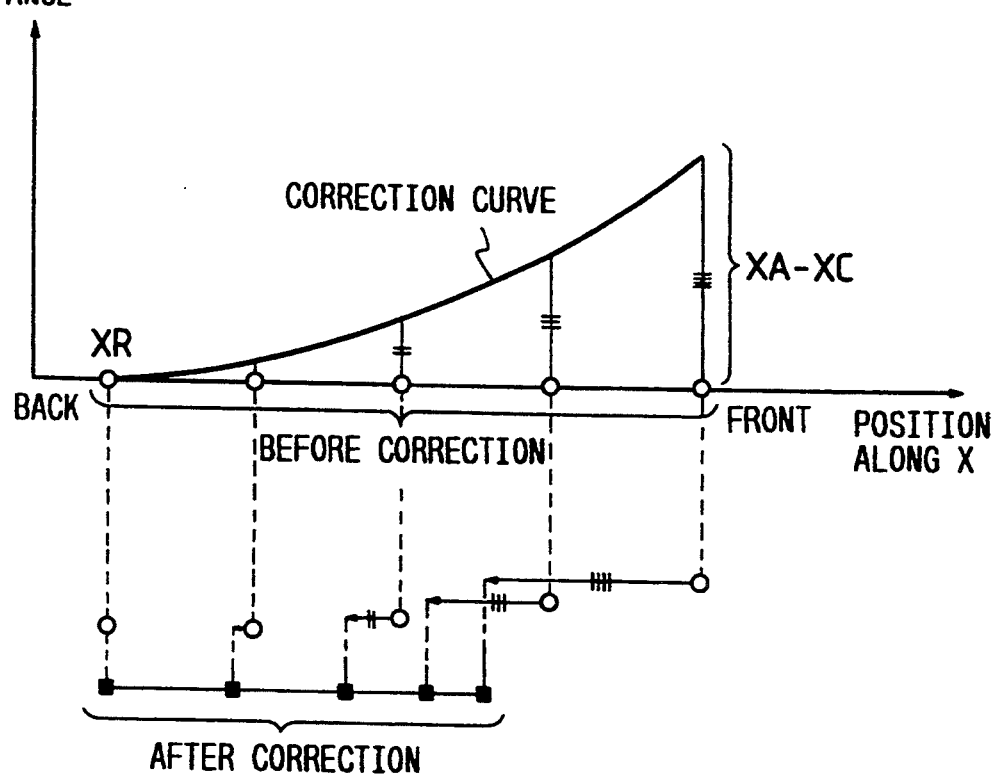
FIG. 7 is a diagram showing a non-linear correction curve for providing shift amounts for motion compensation according to the present invention.

When the motion of an object to be imaged repeats expansion and contraction due to respiration, projection views derived corresponding to measurements A1 and C1 in FIG. 3 would become projection views A and C in FIG. 6, for example. The same result would occur with measurements A2 and C2 in FIG. 5. Here, in the same manner as in the foregoing case, the position of an edge XB of a projection view for B1 can be estimated by interpolation using detected edges XA and XC. In such a case, it is preferable to correct displacements by the contraction projection views using the most contracted projection view as a reference. Namely, when the projection view C in FIG. 6 is the most contracted projection view, the projection view A of a low-order view is obtained using the distance between the detected edge positions XA and XC as displacement information. Also, a high-order projection view B is obtained using the distance between the estimated edge position XB and the detected edge position XC as a displacement information. Displacements in each tissue in visceral form due to respiration is not proportional to the distance from a substantially stationary or non-moving point XR to the corresponding tissue. Accordingly, it is preferable to employ a correction curve which is non-linear and having a high-order function as is shown in FIG. 7 to provide a shift distance for data of each position. Thus, in the methods described hereinabove, displacements in high-order projection views are estimated by use of an interpolation technique. It is not necessary to apply interpolaration to the total portion of a projection view, but rather it is sufficient to apply interpolation to only some edge points representative of the projection view. Further, it is to be clearly understood that displacements of one edge detected in more than two low-order projection views can be used for interpolation of displacement of that edge for one high-order projection view. Namely, data for interpolation can arbitrarily be selected from a wider range than explained above by referring FIGS. 3 and 4. Further, the interpolation method is not limited to the linear interpolation method described hereinabove, but any of other interpolation methods suitable for this purpose may be adopted.

By combining the foregoing methods with a motion detecting method utilizing navigator echoes, it is possible to provide methods to eliminate artifacts and unsharpness due to multi-dimensional motion of the object during MR signal acquisition. The entire sequence including parts I and II of FIG. 1 represents a typical example of a signal measurement sequence employed in one of such combined methods with navigator echoes. Here, the variation sequence of phase encoding pulse 11 complies with the variation sequence of one of the foregoing embodiments. The first echo 15 measured in the presence of readout field gradient 14 forms data for imaging. The readout field gradient 14 is applied along the X-direction, body motion along the x-direction can be detected according to the method hereinabove described. The phase encoding pulse 11 is cancelled by phase encoding pulse 12. Then, a second 180° RF pulse is applied to generate a second echo 16. The second echo 16 is measured in the presence of field gradient 13 along the y-direction. Accordingly, the echo 16 is frequency-encoded along the y-direction. The measured echo 16 is subjected to one-dimensional Fourier transformation to produce a projection view along the y-direction. The projection view indicates displacement of the object along the y-direction when a corresponding magnetic resonance view is measured. So, the motion of the object along the y-direction during the MR signal acquisition can be detected in series of projection data derived from each time of detection of the echo 16, as shown in part II of FIG. 1, and is called a navigator echo as described in Radiology 1989, 173, pp. 225-263.

Figure 8:
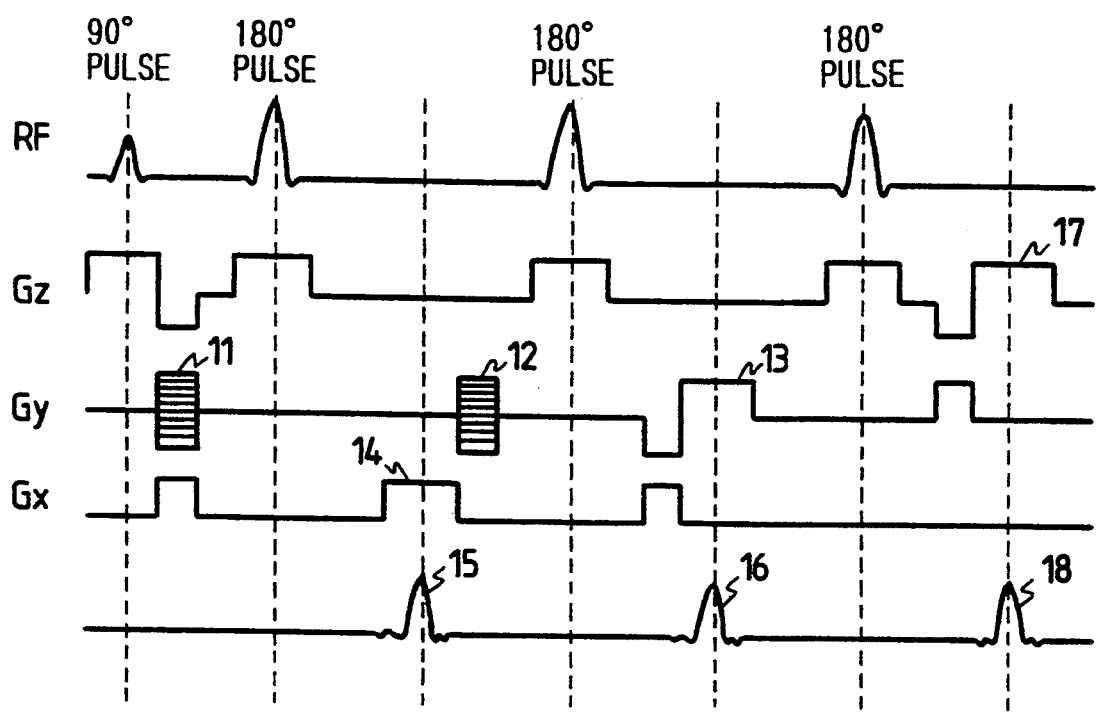
FIG. 8 is a diagram showing a signal measurement sequence employed in another embodiment of the invention.

Utilizing the thus detected two-dimensional motional information enables two-dimensional motion compensation. Further, motion along the Z-direction can also be detected by adding another extra echo generation and detection to the sequence of FIG. 1. The modified sequence is shown in FIG. 8. The extra echo 18 is generated by application of a third 180° RF pulse and is measured in the presence of the Z-direction field gradient 17. Accordingly, echo 18 is a Z-direction navigator echo from which displacement along the Z-direction can be detected. By employing the measurement sequence shown in FIG. 8, three-dimensional motion detection and compensation therefor can be realized. According to a method using extra echoes, the number of extra echo generation or extra echo detection is lower than the original navigator echo method disclosed in Radiology, 1989, 173 pp 255-263, because displacement information along the readout direction is derived from an imaging echo itself.

Figure 9A:
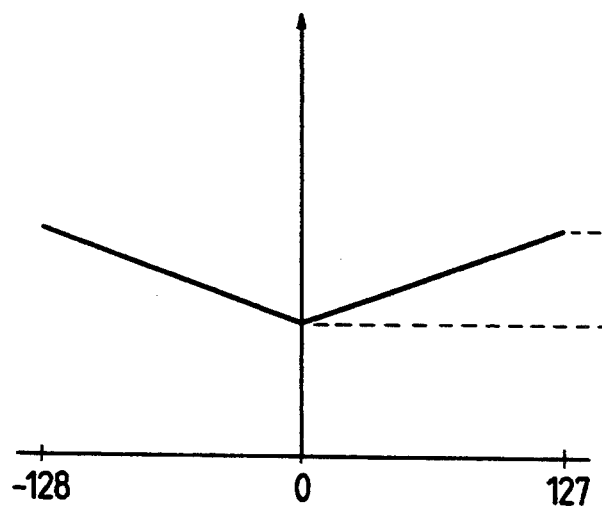
FIGS. 9A and 9B illustrate a relationship between respiration and phase encoding amount.
Figure 9B:
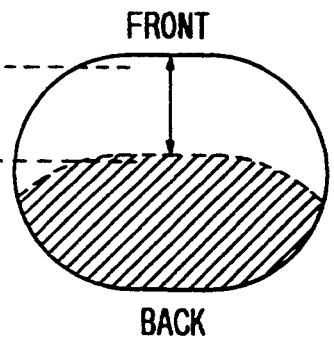

Another embodiment of the present invention will be described by referring to FIGS. 9A, 9B and 10A and 10B. As previously described, the ROPE method is available as one of the suppressing methods for suppressing artifacts due to respiration. This method utilizes a specific property that one amount of artifacts varies with the changes in a relationship between the displacement due to respiratory motion and the phase-encoding amount as described in the Journal of Computer Assisted Tomograph, 9 (4) pp 835-838, (1985). The motional artifact tends to be suppressed when signals are measured by applying a large phase-encoding amount when the displacement due to respiration is greater, as shown in FIGS. 9A and 9B, for example, and by applying a small phase-encoding amount when the displacement due to respiration is smaller. According to this method, however, an appropriate phase encoding amount to be applied in the next sequence to follow must be determined by always monitoring respiration, thereby requiring additional equipment for respiration monitoring as has been described above with respect to the ROPE method.

In contrast, the measurement method of the embodiment shown in FIGS. 10A and 10B eliminates the need for any additional equipment of the kind as described above. For a certain period of time SL-1 after the measurement is started, MR echoes are measured with the phase-encoding amount maintained at zero. Displacement (positions of body front) P1', P2', P3' and the like are obtained from projection images which have been obtained by subjecting data of echoes to one-dimensional Fourier transformation. Then the most expanded position (fully inhaled condition), the most contracted position (fully exhaled condition) and cycle of the motion are determined as movement information. Thereafter, in the period of SL-2, imaging signals are acquired by repeating a measurement sequence with changing phase-encoding amounts for as many times as required, for example, 256 times to obtain views necessary for one frame of an image. A phase-encoding amount suitable for the first measurement is determined by estimating displacement of the body front P0 as represented in FIGS. 10A and 10B based upon previously detected displacements P1', P2', P3' and the like A phase encoding amount suitable for the second measurement is determined by estimating P1 by using P0 and P1', and the like. At this time, one of two values is utilized as P0 for the estimation of P1 according to the following conditions. When displacement P0 obtained by a previous estimation is large, such represents that when a large phase-encoding amount is chosen for the first view, the value obtained by estimation is utilized as it is. In cases other than the above, such represents that when the first view is a low-order view, a displacement value detected in a projection view which has been derived from an actually measured view is utilized.

Measurements for the third view and those to follow are carried out in the same way as above. The distinction between "low-order views" and "high-order views" in this embodiment is the same as described above in that displacement can be effectively detected in the "low-order views".

According to the embodiments of the invention, because a phase encoding amount suitable for the next view measurement is determined by monitoring body motion utilizing motional information during the preceding imaging signal acquisition sequence, no additional equipment is needed as required to the ROPE method.

While we have shown and described several embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

We claim:

1. Magnetic resonance imaging method for obtaining an image of an object laid in a space in which a static magnetic field is applied, the method comprising the steps of:

A) sequentially measuring a plurality of magnetic resonance views with a plurality of encodings by repeating a measurement sequence including substeps of:
   a) exciting nuclear spins in said object,
   b) applying a phase-encoding field gradient along a first direction with programmed time integral to encode the excited spins, and
   c) detecting the encoded spins in the presence of a readout field gradient along a second direction to generate a magnetic resonance view,
   wherein measurements of magnetic resonance views with at least low-order encodings are obtained during the repetition of the measurement sequence;
   B) subjecting respective magnetic resonance views to a first Fourier transformation so as to generate a plurality of projection views with a plurality of encodings forming a data matrix of a hybrid domain;
   C) correcting displacements in respective projection views due to motion of the object using displacement information obtained from projection views with low-order encodings so as to generate a corrected data matrix in the hybrid domain for generating the image of the object based on the corrected projection views including low-order encodings; and
   D) subjecting the corrected data matrix to a second Fourier transformation so as to generate the image of the object.

2. Magnetic resonance imaging method according to claim 1, wherein measurements of magnetic resonance views with high-order encodings are obtained.

3. Magnetic resonance imaging method according to claim 2, wherein at least one measurement of a magnetic resonance view with high-order encoding is obtained between two measurements of magnetic resonance views with low-order encodings.

4. Magnetic resonance imaging method according to claim 3, wherein a plurality of measurements of magnetic resonance views with high-order encodings are obtained between two measurements of magnetic resonance views with low-order encodings.

5. Magnetic resonance imaging method according to claim 2, wherein measurements of magnetic resonance views with low-order encodings and high-order encodings are alternately obtained.

6. Magnetic resonance imaging method according to claim 2, wherein measurements of magnetic resonance views with low-order encodings and high-order encodings are obtained randomly.

7. Magnetic resonance imaging method according to claim 1, wherein said step of correcting including substeps of:
   a) detecting displacements in projection views with low-order encodings;
   b) estimating displacements in projection views with high-order encodings by using the detected displacements in projection views with low-order encodings;
   c) correcting the detected displacements in the projection views with low-order encodings; and
   d) correcting the estimated displacements in the projection views with high-order encodings.

8. Magnetic resonance imaging method according to claim 7, wherein said step of detecting displacements includes detecting positions of edges of the projection views.

9. Magnetic resonance imaging method according to claim 7, wherein said step of estimating displacements includes utilizing linear interpolation.

10. Magnetic resonance imaging method according to claim 1, wherein said second direction along which the readout gradient is generated is selected as a direction of a main axis of motion of the object.

11. Magnetic resonance imaging method according to claim 1, wherein the step of correction of projection views includes effecting a data shift in accordance with a non-linear function.

12. Magnetic resonance imaging method according to claim 1, wherein the measurements of magnetic resonance views with low-order encodings includes plural measurements with a same phase encoding amount at different times.

13. Magnetic resonance imaging method according to claim 1, wherein the measurements of magnetic resonance views of low-order encodings are obtained at a timing shorter than one half cycle of a cyclic motion of the object.

14. Magnetic resonance imaging method according to claim 1, wherein said measurement sequence further includes substeps for generating an extra echo without phase-encodings and for detecting the extra echo in the presence of a field gradient along a direction other than the second direction so as to obtain information of displacements due to multi-axis motion of the object.

15. Magnetic resonance imaging method according to claim 1, wherein in step A) plural measurements of magnetic resonance views with a same encoding amount of low-order are obtained at different timings, and step C) includes the step of adding projection views with the same encoding amount so as to obtain an averaged projection view, and utilizing the averaged projection view to generate a corrected data matrix.

16. Magnetic resonance imaging method according to claim 1, wherein phase-encoding amounts of the low-order encodings are not larger than one half of the maximum phase-encoding amount.

17. Magnetic resonance imaging method according to claim 1, wherein phase-encoding amounts of the low-order encodings are not larger than one quarter of the maximum phase-encoding amount.

18. Magnetic resonance imaging method for obtaining an image of an object laid in a space in which a static magnetic field is applied, the method comprising the steps of:

A) sequentially measuring a plurality of magnetic resonance views with a plurality of encodings by repeating a measurement sequence including substeps of:
   a) exiting nuclear spins in said object,
   b) applying a phase-encoding field gradient along a first direction with time integral to encode the excited spins, and
   c) detecting the encoded spins in the presence of a readout field gradient along a second direction to generate a magnetic resonance view, wherein measurements of extra magnetic resonance views with zero or around zero encoding are obtained between measurements of high-order magnetic resonance views;

B) subjecting respective magnetic resonance views and extra magnetic resonance views to a first Fourier transformation so as to generate projection views with a plurality of encodings including the extra magnetic resonance views;

C) detecting displacements in low-order projection views and in the projection views of extra magnetic resonance views caused due to motion of the object;

D) estimating displacements in high-order projection views by using detected displacements in low-order projections and in projection views of extra magnetic resonance views;

E) correcting detected and estimated displacements in respective projection views so as to form a data matrix of corrected projection views; and F) subjecting the data matrix to a second Fourier transformation so as to generate the image of the object.

19. Magnetic resonance imaging method for obtaining an image of an object laid in a space in which a static magnetic field is applied, the method comprising the steps of:

a) exciting nuclear spins in said object, b) applying a phase-encoding field gradient along a first direction with changeable time integral to encode the excited spins with a phase-encoding amount, c) detecting the encoded spins in the presence of a readout field gradient along a second direction, d) deriving a projection view from the detected spins, e) detecting displacement of the object from the derived projection view when the projection view is a low-order projection view, and f) repeating steps a) to e) while changing the phase-encoding amount to obtain a plurality of projection views with a plurality of encodings, wherein the phase-encoding amount for each repetition time is selected in accordance with an estimated displacement of the object at a repetition time which is estimated by using previously detected and previously estimated displacement data.

* * * * *